United States Patent [19]

Boisson et al.

[11] Patent Number: 4,876,698
[45] Date of Patent: Oct. 24, 1989

[54] SYSTEM FOR TRANSMITTING SEQUENCES OF DIGITAL SAMPLES ENCODED BY VARIABLE-LENGTH BINARY WORDS

[75] Inventors: Jean-Yves Boisson, Clamart; Jean-Paul Bastien, Maisse, both of France

[73] Assignee: Telecommunications Radioelectriques et Telephoniques, Paris, France

[21] Appl. No.: 211,307

[22] Filed: Jun. 24, 1988

[30] Foreign Application Priority Data

Jul. 3, 1987 [FR] France ................... 87 09446

[51] Int. Cl.$^4$ ............................................. H04B 14/04
[52] U.S. Cl. ........................................ 375/25; 358/141
[58] Field of Search .................... 375/121, 122, 25, 31; 358/141, 148, 133, 261; 370/82, 83

[56] References Cited

U.S. PATENT DOCUMENTS 4,298,978  11/1981  Nakamura ........................... 370/82
4,491,869  1/1985   Heitmann ............................ 375/25
4,660,079  4/1987   Devimeux et al. .................. 375/25

Primary Examiner—Robert L. Griffin
Assistant Examiner—Marianne Huseman
Attorney, Agent, or Firm—Michael E. Marion

[57] ABSTRACT

A system for transmitting sequences of digital samples encoded by variable-length binary words is formed on the one hand by a transmitter device comprising a statistic encoding circuit for encoding in said variable-length words words of a fixed length appearing at its input in the shape of sample sequences, a synchronizing circuit for forming synchronizing words which define the position of the variable-length words in the sequences and a multiplexer circuit for combining, in view of their transmission, the synchronizing words with the variable-length words, and, on the other hand, a receiver device comprising a demultiplexer circuit for applying from one of its two outputs the variable-length words received to a statistic decoding circuit for recovering the fixed-length words and for applying from the other output the synchronizing word to a processing circuit for restituting, in the event of a transmission error, the position of the samples in the sequence.

1 Claim, 3 Drawing Sheets

SYSTEM FOR TRANSMITTING SEQUENCES OF DIGITAL SAMPLES ENCODED BY VARIABLE-LENGTH BINARY WORDS

BACKGROUND OF THE INVENTION

The present invention relates to a system for transmitting sequences of digital samples encoded by variable-length binary words, the system being formed on the one hand by a transmitter device comprising a statistic encoding circuit for encoding in said variable-length words, words of a fixed length appearing at its input as a sequence of samples, a synchronizing circuit for forming synchronizing words which define the position of the variable-length words in the sequences and a multiplexer circuit for combining, in view of their transmission, the synchronizing words with the variable-length words, and, on the other hand, a receiver device comprising a demultiplexer circuit for applying from one of its two outputs the variable-length words received to a statistic decoding circuit for recovering the fixed-length words and from its other output the synchronizing word to a processing circuit for recovering, in the event of a transmission error, the position of the samples in the sequences.

Such a system is used with great advantage in more specifically the transmission, in digital form, of television pictures, each sample sequence then representing a line of a picture and the samples representing the picture elements (pixels).

U.S. Pat. No. 3,971,888 discloses a system of this type of said usage.

The problems encountered in this type of system is that it is sensitive to transmission errors. A transmission error affects in the first place the binary word containing this error and may have repercussions on the subsequent words; the result is that, although ultimately the words are received in the appropriate manner, they no longer correspond to the position of the sample in the sequence. This change in position propagates from line to line and then a picture of a significantly degraded quality is received. To solve this problem partially, said United States Patent recommends the transmission of synchronizing words at the beginning of the sequence and to protect them by an error correcting code. However, these recommended measures proved to be little effective when error packets occur whose duration exceeds the duration of the synchronizing word and whose appearance more or less coincides with this word. The synchronizing word is then cancelled and it cannot perform its part any more.

SUMMARY OF THE INVENTION

The present invention has for its object to provide a transmission system of the type defined in the opening paragraph, which has an adequate immunity to errors occurring packet wise.

To that end, such a system is characterized in that combining means are provided for adding an error detecting code to the synchronizing words and control means for the multiplexer circuit for distributing over the sequences the bits constituting the synchronizing word in combination with the error detecting code.

The following description which is given by way of nonlimitative example with reference to the accompanying drawings, will make it better understood how the invention can be put into effect.

DETAILED DESCRIPTION OF THE INVENTION

Figure 1:
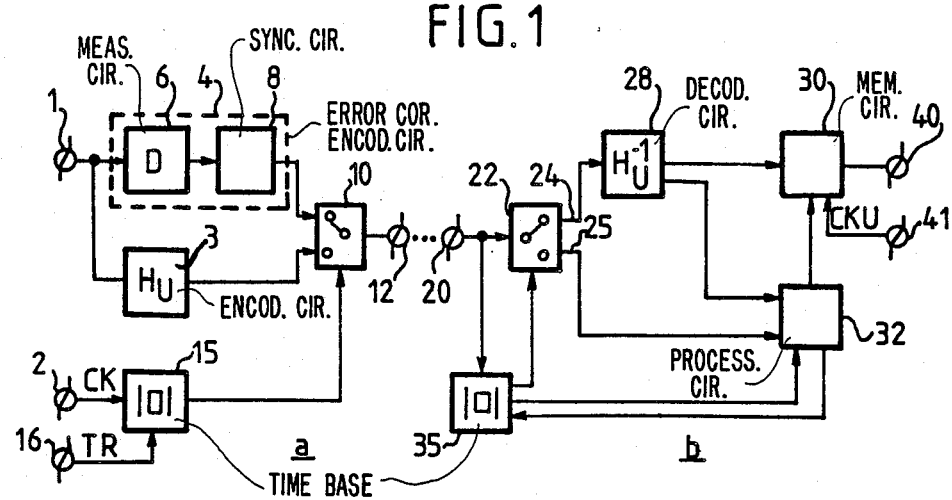
FIG. 1 is a schematic view of a transmission system in accordance with the invention.

FIG. 1 shows the system of the invention: the transmitter device is shown at a and the receiver device at b. The digital samples to be transmitted are applied to the terminal 1 of the transmitter device. These digital samples, constituted by words having a fixed length of four bits, appear at this terminal, sample by sample, at the rate of a clock signal CK applied to terminal 2. As these samples relate to the coding of television pictures, they appear in sequences, each of which relates to a picture line. As a basic idea, let it be assumed that there are 625 sequences which are transmitted in two fields of 312 and 313 lines.

Figure 2:
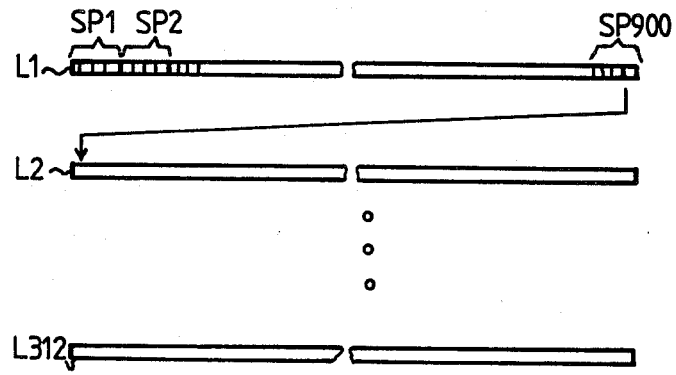
FIG. 2 shows sampling sequences to be encoded.

FIG. 2 shows, very schematically, a field of 312 lines L1 ... L312. Each line is formed by a sequence of 900 samples SP1 ... SP900, of which 720 samples represent the luminance and 180 represent a chrominance information. To encode these samples in accordance with a statistical code, the transmitter device includes an encoding circuit 3 which effects a Huffman coding operation. This type of encoding is described more specifically in paragraph 6.2.3.2, page 239 of the document "Digital Image Processing" By R.C. Conzales and P. Lins, published in 1977 by Addison-Wesley Publishing Company. In accordance with this mode of encoding, words of small length (1 bit) are assigned to words of fixed length which occur often and words of long length (8 bits) are assigned to words which occur the least. Thus, in accordance with this example now described, 900 samples will be encoded for the transmission by a number of bits ranging from 900 to 7200. it is always advisable to add a certain number of bits to this number of bits, to ensure the line synchronization. For that purpose, a synchronizing circuit 4 is provided which, by means of a measuring circuit 6, determines the length of bits of each line (or sequence) and which protects this measurement by means of an error correction encoding circuit 8. From its output 12 a multiplexer circuit 10 supplies the variable-length binary words in combination with the synchronizing words processed by the synchronizing circuit 4. The multiplexer circuit 10 is controlled by a time base 15 which receives the signals CK and is periodically triggered by the end-of-field signals TR applied to the terminal 16.

The receiver device shown at b receives at its input terminal 20 the combination of the transmitted words. A multiplexer circuit 22 supplies from its first output 24 the transmitted variable-length words and the synchronizing words from its second output 25; a decoding circuit 28 which performs the opposite operation of the encoding circuit 22 is connected to the output 24. The circuit 28 returns words of a fixed length to a memory circuit 30; connected to the output 25 is a processing circuit 32 which on the one hand applies to the memory circuit 30 a complete cycle of address codes, corresponding to the storage of a line and on the other hand applies triggering signals to a receiving time base 35. This time base 35 is used more specifically for the control of the demultiplexer circuit 22. The samples transmitted at the rate CKU of a utilization clock are taken from the output terminal 40, which is connected to the output of the memory 30. The signals determining this rate are received at a terminal 41.

In accordance with the invention, to ensure the best possible efficiency of the synchronizing word, control means are provided to distribute in the lines (or sequences) the bits constituting the synchronizing word.

Figure 3:
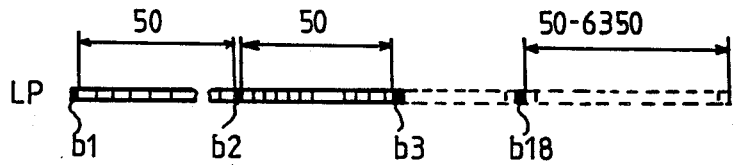
FIG. 3 shows a possible distribution, in accordance with the invention, of the bits of the synchronizing word.

FIG. 3 shows a possible distribution of the bits of the synchronizing word within a sequence representing a line $L_p$. The synchronizing word formed of 18 bits y is distributed at the rate of one bit b1, b2, ..., b18 for each packet of 50 bits. The bit b1 being placed at the beginning of the sequence, there remains a location ranging from 50 to 6350 bits between the bit b18 and the end of the sequence and it will be obvious that a minimum interval of 50 bits is always preserved,, which provides an appropriate immunity against error packets.

The synchronizing word D is formed by a 13-bit word D' to provide the difference between the length LG in the bit of the sequence to which it is assigned and the average length of the lines which was fixed at 2160, so that: and also by a word D" of 5 bits intended to protect the word D' in accordance with the error correcting procedure which is well-known to a person skilled in the art and which need not to be further described here.

Figure 4:
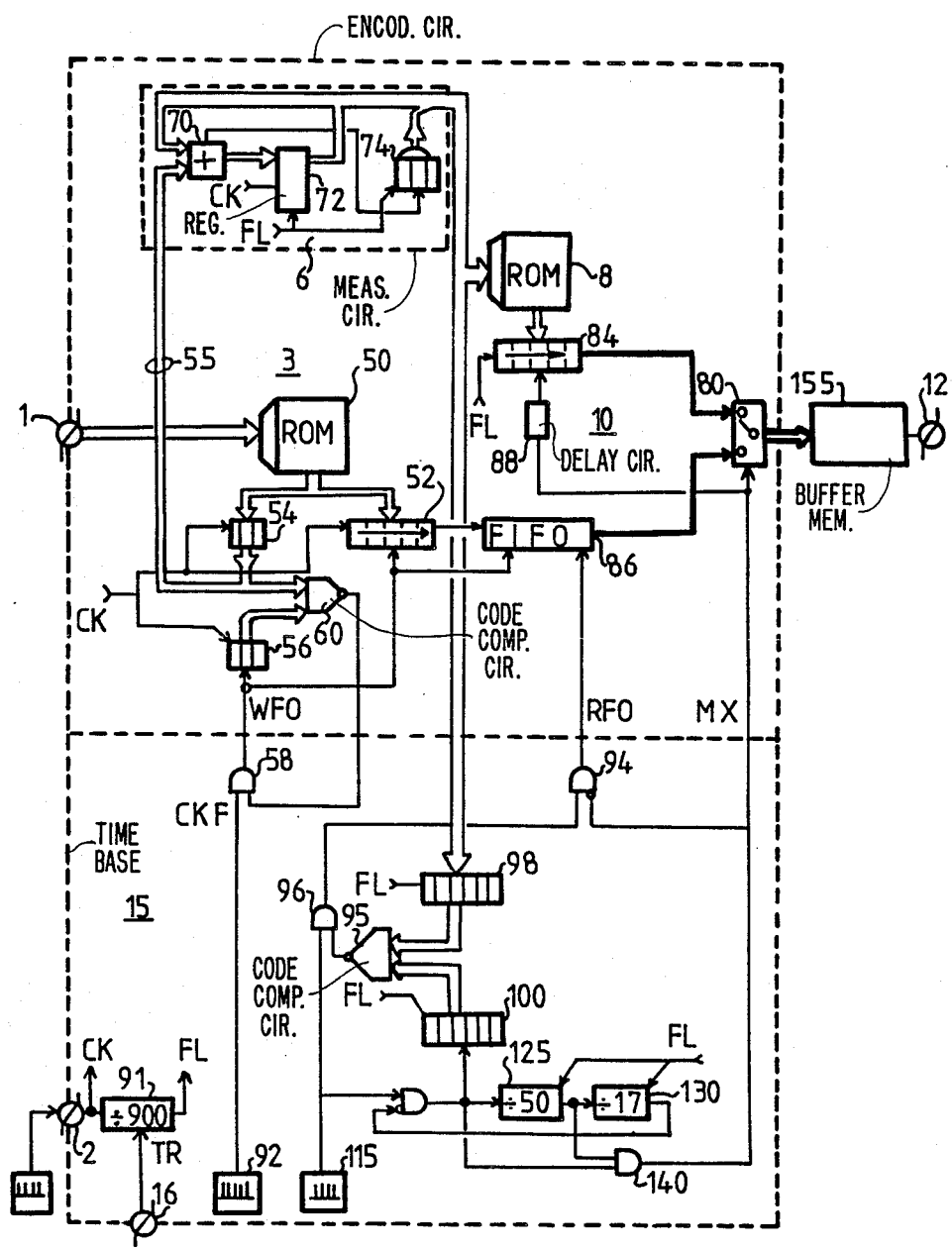
FIG. 4 shows, in greater detail, the structure of the transmitter device of the invention.

FIG. 4 shows in greater detail the structure of the transmitter device.

The encoding circuit 3 is build-up around a preprogrammed read-only memory 50. The addressing input of this memory receives the samples from the terminal 1 and the statistic code which is stored in a shift register 52 and also an indication of its length which is stored in a register 54 are taken from the output of this memory. From now on it is sufficient to note that the information contained in the register 54 will be used by the circuit 6 to account for the number of bits in a line. For that purpose, a link 55 between the register 54 and the circuit 6 is provided. These registers 52 and 54 are loaded at the rate of the signal CK. The register 52 is unloaded by shifting by means of a signal WFO at a rate which is sufficiently fast to ensure that between two appearances of the active signal CK, the longest possible variable length word contained in the register 52 can be shifted completely. This rate is defined by means of a signal CKF which is applied to a counter 56 via an AND-gate 58; the signal WFO appears at the output of this gate. A code comparator 60 compares the content of the register 54 with a content of the counter 56; from the moment there is equality, its output renders the gate 58 non-conductive, so that the signals CKF are no longer applied to the counter 56; since the output signal EFO of this gate is applied to the shift control of the register 52, this register 52 has been shifted as many times as is indicated in the register 54. The counter 56 is retriggered each time the signal CK becomes active.

As has been described in the foregoing, the measuring circuit 6 utilizes the information contained in the register 54 to enable it to accumulate this number for a full line. To this end, it uses an accumulator formed by an adder 70 which is coupled to a summing register 72. The adder 70 adds together the contents of the registers 54 and 72 and the result is added up at each appearance of the active signal CK in the register 72. A counter 74 counts any carries processed by the adder 70. The number of bits of a line is consequently obtained by the concatenation of the contents of the register 72 and the counter 74. A signal FL indicating an end of the line to be processed periodically resets this register and the counter 74 to zero. To protect this number by an error correcting code, a read-only memory is used which is critically programmed to constitute the error correction encoding circuit 8.

The multiplexing circuit 10 formed by a multiplexing circuit 80 having two inputs, a first input being connected to the output of a shift register 84 effecting a parallel-to-series conversion for the code originating from the circuit 8, a second input being connected to the output of a FIFO memory 86; the input of this memory is connected to the output of the shift register 52. Writing this memory is consequently effected with the aid of the signal WFO at the same rate as shifting in this register 52. The control of the multiplexer circuit 80 is effected by a signal MX, that is to say when this signal is active, the bit of the register 84 is transferred to the output of the circuit 80 and thereafter, when this signal is no longer active, the bits at the output of the FIFO memory are transmitted. Because of the presence of a delay circuit 88 connected to the shift control input of the register 84 and provided to delay the signal MX, the register 84 will be shifted one step, soon after the signal MX has become unactive.

The capacity of the FIFO memory 86 must be sufficient to contain more than one line, that is to say it must exceed 7200 bits; in this memory each encoded line between each appearance of the signals FL must be taken off.

The time base 15 supplies the different signals in question.

The signals CK originating from the terminal 2 remain identical. The signals FL originate from a divide-by-900 frequency divider 91, which corresponds to the number of picture elements of a line. This divider is triggered by the signal TR coming from the terminal 16.

The signal CKF is produced by a high-rate generator 92.

The signal RFO originates from the output of an AND-gate 94 one input of which is connected to the output of a code comparator circuit 95 via an AND-gate 96. This circuit compares the codes contained on the one hand in a register 98 intended to contain the number of bits of a line to be transmitted (this number of bits is obtained from the output of the circuit 6) and on the other hand is a counter 100. Loading the register 98 and triggering the counter 100 is effected by the active signal FL. This counter 100 is incremented at the rate of the output signals of a rate generator 115 which are conveyed via an AND-gate 118. The signals from this generator 115 are moreover applied, always via the AND-gate 118, to a divide-by-50 frequency divider denoted by reference numeral 125. This divide-by-50 rate corresponds to the spacing between two bits of the synchronizing words (see FIG. 3). Connected to this divider 125 is a further divider 130 whose output signal blocks the gate 118 via the inverting input 132 of the further divider, when 17 spacings have been counted. An AND-gate 140 conveys the signals MX towards the circuit 80. The two inputs of the gate 140 are connected to the respective outputs of the gate 118 and the divider 125. A buffer memory member 155 permits matching the rate of the data applied to the output of the circuit 80 to the rate of the transmission channel connected at 12. The mode of operation of this type of member 155 can be understood from the article by Toshio Koga, entitled "Statistical Performance Analysis of an Interframe Encoder for Broadcast Television Signals", published in IEEE COOM-29, no. 12, Dec. 1981, pp. 1868-1876.

Figure 5:
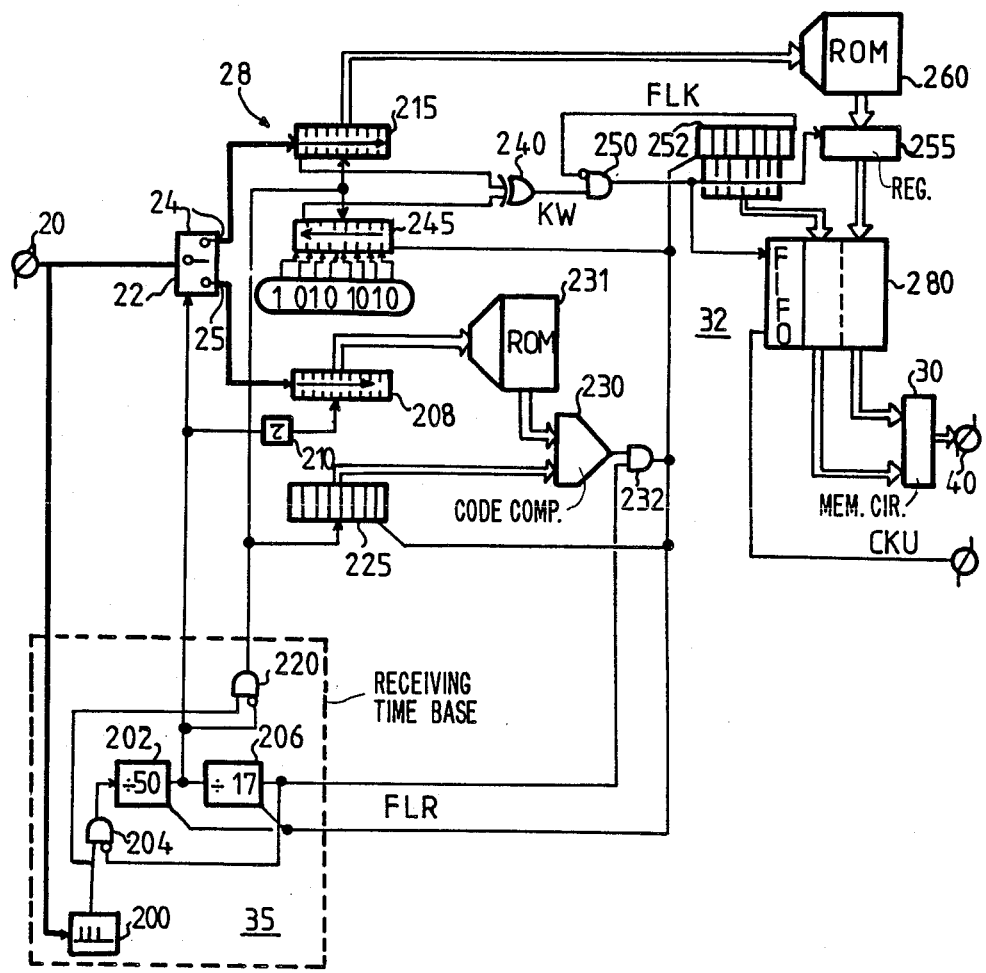
FIG. 5 shows, in greater detail, a receiver device of the invention.

FIG. 5 is a detailed representation of a receiver device. The received data are applied first of all to the receiving time base 35. A clock recovery circuit 200 produces from the signals received a signal whose rate is the transmission rate of the channel. This signal is applied, in a member similar to that already described for the transmitter device, to a first divider 202 via an AND-gate 204 which has an inverting input for connection to the output of a second divider 206. These cascaded dividers 202 and 204 divide by "50" and "17", respectively. The output signal of the divider 202 controls the demultiplexer circuit 22 to ensure that the received bits of the synchronizing word are stored in a shift register 208. Shifting this register is effected by means of an output signal of the divider 202, which signal is delayed (for a short instant relative to the rate of the circuit 200) by the delay circuit 210. The bits of the encoded words transmitted with variable lengths are stored in a shift register 215 at the rate of a signal produced by an AND-gate 220, one input of which is connected to the output of the circuit 200 and a further input, an inverting input, to the output of the divider 202. It should be noted that the divider 202 and 206 have a triggering input to which a signal FLR is applied. This active signal sets the divider 202 to "1" and the divider 206 to "0". This signal FLR is processed in the following manner. A counter 225 counts the pulses of the output signal of the gate 220 and consequently the bits constituting the picture lines. A code comparator 230 compares the code at the output of a read-only memory 231 which effects the inverse operation of error coding on the word contained in the register 208 with the code contained in the counter 225; the output signal of the comparator is applied to an AND-gate 232 to be validated by the output signal of the divider 206; thus it is ensured that this signal is not taken into account until it is certain that the synchronizing word has completely been stored in the register 208. The output signal of this gate 232 constitutes the signal FLR which, when it is active, resets the content of the counter 225 to zero.

The mode of operation of the decoder 28 is based on the following considerations. Each received bit is examined in the first stage of the register 215 by means of an EXCLUSIVE-OR gate 240 which supplies a signal KW. Let is be assumed that the shortest word is formed by the signal bit "1". This will indicate that the other words start by "0", the longest binary words (two bits) may be "00", and the 3-bit binary words may be "011", the 4-bit binary words may be "0100". . . etc. It will be obvious that when a words such as 10101010 is loaded into a shift register 245 and the other input of the gate 240 examines the last position of the register 245 and when the first received bit is "1" there is coincidence and the word is consequently recognized. If it is a "0", the registers 215 and 245 are shifted one step when the second received bit is a "0", the binary word "00" is recognized and so forth for the other bits.

The signal KW is transmitted, via an AND-gate 215 having an inverting input, to a counter 252 to increment this counter, this counter being modulo 900, and also to the load control of a register 255 which is connected to the output of a ROM memory 260 which transcodes the recognized variable-length words contained in the register 215 into words of fixed length. As soon as the counter 252 has reached the count 900, it supplies an active signal FLK which, applied to the inverting input of the gate 250, renders this gate non-conductive and loading the register 255 is interrupted. It should be noted that the signal FLR causes the register 245 to be loaded and thus triggers the procedure of recognizing variable-length words and that this signal resets the counter 252 to zero.

The contents of the counter 252 of the register 255 are stored at the rate of the output signal of the gate 250 in a FIFO memory 280. This memory is read at the rate of a signal CKU produced by the utilizer, the memory circuit 30 stores the different fixed-length codes in the addresses indicated by the counter 252.

It will be clear that the signal FLR synchronizes the entire mode of operation and that it acts with priority on the signal FLK. In normal operation, these two signals must be active simultaneously.

If the signal FLK becomes active before the signal FLR, the counter 252 and loading the register 255 are blocked; the appearance of the signal FLR resets the counter 252 to zero and thus renders the gate 250 conductive, so that the recognizing procedure is restarted.

If the signal FLR occurs before the signal FLK, whatever the content of the counter 252, this counter is retriggered.

What is claimed is:

1. A system for transmitting and receiving sequences of digital samples, said system comprising:
   (a) a transmitter device comprising means for encoding as variable length words a plurality of said sequences provided as words of a fixed length at an input thereof, a synchronizing means coupled to said encoding means for forming synchronizing words which define the position of respective ones of said variable length words within the sequences, a multiplexer means coupled to said synchronizing means for combining said synchronizing words with said variable length words and;
   (b) a receiver device comprising demultiplexing means for providing at a first output said variable length words received from said transmitting device to a decoding means coupled thereto for recovering said fixed length words, and for providing at a second output said synchronizing words to a processing means coupled thereto for restoring in the event of a transmission error, the position of said digital samples in said sequences, characterized in that said system further comprises combining means for combining an error detecting code with said synchronizing words and said synchronizing means comprises control means for distributing said synchronizing words combined with said error detection code.

* * * * *